US012584209B2

(12) United States Patent
Chen et al.

(10) Patent No.: US 12,584,209 B2
(45) Date of Patent: Mar. 24, 2026

(54) FLUOROCARBON/PALLADIUM/ MAGNESIUM-SCANDIUM HYDROGEN-CHROMIC FILM AND PREPARATION METHOD THEREOF

(71) Applicant: SHANGHAI JIAO TONG UNIVERSITY, Shanghai (CN)

(72) Inventors: Juan Chen, Shanghai (CN); Haolan Fang, Shanghai (CN); Liming Peng, Shanghai (CN); Junjia Liu, Shanghai (CN); Wei Shen, Shanghai (CN); Tingyan Wang, Shanghai (CN); Yan Chen, Shanghai (CN); Wenjiang Ding, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 39 days.

(21) Appl. No.: 18/715,117

(22) PCT Filed: Apr. 27, 2022

(86) PCT No.: PCT/CN2022/089434
§ 371 (c)(1),
(2) Date: May 31, 2024

(87) PCT Pub. No.: WO2022/228448
PCT Pub. Date: Nov. 3, 2022

(65) Prior Publication Data
US 2025/0027192 A1      Jan. 23, 2025

(30) Foreign Application Priority Data
Apr. 29, 2021    (CN) .......................... 202110476304.5

(51) Int. Cl.
*C23C 14/35* (2006.01)
*B01J 23/44* (2006.01)
(Continued)

(52) U.S. Cl.
CPC .............. *C23C 14/35* (2013.01); *B01J 23/44* (2013.01); *B01J 33/00* (2013.01); *B01J 37/0215* (2013.01);
(Continued)

(58) Field of Classification Search
CPC ........................................ C23C 14/06–14/205
See application file for complete search history.

(56) References Cited

U.S. PATENT DOCUMENTS

2008/0206642 A1      8/2008   Niessen et al.
2018/0164611 A1*     6/2018   Fujino ................. G02F 1/15165

FOREIGN PATENT DOCUMENTS

CN          101164185 A        4/2008
CN          104342617 A        2/2015
(Continued)

OTHER PUBLICATIONS

Machine translation of CN109136841. Retrieved Sep. 15, 2025.*
(Continued)

*Primary Examiner* — Prashant J Khatri
(74) *Attorney, Agent, or Firm* — Bayramoglu Law Offices LLC

(57) ABSTRACT

A fluorocarbon/palladium/magnesium-scandium hydrogen-chromic film and a preparation method thereof are provided. The film includes a magnesium-scandium composite film layer, a palladium catalytic layer, and a fluorocarbon film layer that are sequentially arranged on a substrate. The preparation method includes: growing the magnesium-scandium composite film layer on the substrate first, then growing the palladium catalytic layer in situ on the magnesium-scandium layer, and finally depositing the fluorocarbon film
(Continued)

layer on Pd. According to the present invention, the catalytic effect of palladium is utilized to promote reversible conversion between hydrogen and hydrogen atoms during hydrogen absorption and dehydrogenation stages, and a composite scandium element is added to accelerate diffusion of the hydrogen atoms in a magnesium matrix and accelerate formation and decomposition of a hydride, such that the film can be repeatedly and rapidly switched between a reflective state and a transparent state.

20 Claims, 5 Drawing Sheets

(51) Int. Cl.

| | |
|---|---|
| *B01J 33/00* | (2006.01) |
| *B01J 37/02* | (2006.01) |
| *C23C 14/12* | (2006.01) |
| *C23C 14/14* | (2006.01) |
| *C23C 14/34* | (2006.01) |

(52) U.S. Cl.
CPC .............. *C23C 14/12* (2013.01); *C23C 14/14* (2013.01); *C23C 14/3414* (2013.01)

(56) References Cited

FOREIGN PATENT DOCUMENTS

| CN | 109136841 A | 1/2019 |
|---|---|---|
| CN | 112596279 A | 4/2021 |
| CN | 113215544 A | 8/2021 |
| JP | 2004514933 A | 5/2004 |
| JP | 2014026262 A | 2/2014 |

OTHER PUBLICATIONS

R. A. H. Niessen, et al., Hydrogen storage in thin film magnesium-scandium alloys, Journal of Alloys and Compounds, 2005, pp. 457-460, 404-406.

* cited by examiner

FLUOROCARBON/PALLADIUM/MAGNESIUM-SCANDIUM HYDROGEN-CHROMIC FILM AND PREPARATION METHOD THEREOF

CROSS REFERENCE TO THE RELATED APPLICATIONS

This application is the national phase entry of International Application No. PCT/CN2022/089434, filed on Apr. 27, 2022, which is based upon and claims priority to Chinese Patent Application No. 202110476304.5, filed on Apr. 29, 2021, the entire contents of which are incorporated herein by reference.

TECHNICAL FIELD

The present invention belongs to the technical field of hydrogen-chromic films, and specifically relates to a fluorocarbon/palladium/magnesium-scandium hydrogen-chromic film and a preparation method thereof.

BACKGROUND

Hydrogen, as a clean energy carrier, plays a key role in sustainable society in the future. However, when the content of hydrogen in the air is 4-75%, explosion will be caused by open fire. Meanwhile, due to low ignition energy of hydrogen and easy diffusion of hydrogen molecules, hydrogen leakage and other problems should be avoided during hydrogen storage, transportation, and use. On the other hand, as hydrogen is colorless, odorless, and tasteless, and cannot be sensed by humans, sensitive and reliable hydrogen detection devices, namely, hydrogen sensors, are imperative to be equipped.

Previous hydrogen detection work is mainly implemented by catalytic resistance detectors or electrochemical devices. Currently, such devices still have defects to be overcome. For example, such devices need to use electrical leads, and sparks may be caused at sensing points, thereby leading to safety problems. Meanwhile, these detection systems have too large occupied space, expensive consumable materials, and a limited application range. Therefore, several research groups have focused on optical sensors based on hydrogen-chromic films. At present, the most representative hydrogen-chromic film structure is palladium/magnesium-based composite material/quartz glass. Palladium has good gas adsorbability and can be used as a catalytic layer, and a magnesium-based material has high hydrogen storage capacity and can be used as a dimming layer. Currently, existing composite materials include transition metals, rare earth metals, alkali earth metals, transition metal oxides, and the like. However, hydrogen absorption and desorption rates and cyclic durability of existing magnesium-based hydrogen-chromic films need to be further improved to meet the demands of response and durability of the hydrogen sensors. In addition, palladium has poor hydrophobicity, as a result, water molecules produced by dehydrogenation and water vapor in the air easily gather on the surface of a palladium layer and corrode a dimming film. Therefore, the development of a novel hydrogen-chromic dimming film system with excellent optical conversion characteristics of hydrogen absorption and desorption and good cyclic durability is necessary.

Scandium, as a rare earth element, is known as an important "green energy technology metal" and a "key" or "strategic" mineral resource in the 21st century, and has been widely used in structural materials, catalysis, and other fields.

In a previous patent document CN109136841A applied by the inventor, a fluorocarbon/palladium/magnesium-niobium pentoxide gasochromic dimming film and a preparation method thereof are recorded, and the film includes a magnesium-niobium pentoxide composite film layer, a palladium catalytic layer, and a fluorocarbon hydrophobic layer that are sequentially arranged on a substrate. In a patent document CN112596279A, a fluorocarbon/palladium/magnesium-ruthenium system gasochromic dimming film and a preparation method thereof are recorded, and the gasochromic dimming film includes a substrate, a magnesium-ruthenium composite dimming film layer, a palladium catalytic layer, and a fluorocarbon protective film layer that are sequentially arranged. However, hydrogen absorption and desorption rates (the hydrogen absorption reaction time is 80 s and 50 s, respectively, and the hydrogen desorption reaction time is 800 s and 900 s, respectively) and cyclic durability (the dimming interval of the fluorocarbon/palladium/magnesium-niobium pentoxide composite film layer is reduced by 1.5% after 50 cycles) of the fluorocarbon/palladium/magnesium-niobium pentoxide composite film layer and the fluorocarbon/palladium/magnesium-ruthenium system need to be further improved.

SUMMARY

The purposes of the present invention are to overcome the disadvantages of the field of existing dimming films and to provide a fluorocarbon/palladium/magnesium-scandium hydrogen-chromic film and a preparation method thereof. The film can be converted from a reflective state to a transparent state by reacting with hydrogen at normal temperature, and then converted from the transparent state to the reflective state by reacting with air. Compared with a fluorocarbon/palladium/magnesium-niobium pentoxide composite film layer and a fluorocarbon/palladium/magnesium-ruthenium system, the fluorocarbon/palladium/magnesium-scandium system of the present invention has higher hydrogen absorption and desorption rates, better cyclic durability, and a higher application value.

The purposes of the present invention are achieved by adopting the following technical solutions.

The present invention provides a fluorocarbon/palladium/magnesium-scandium hydrogen-chromic film. The film includes a magnesium-scandium composite film layer, a palladium catalytic layer, and a fluorocarbon film layer that are sequentially arranged on a substrate.

Preferably, in the magnesium-scandium composite film layer, a molar percentage of the scandium is 5-75%, more preferably, the molar percentage of the scandium is 13-55%, and most preferably, the molar percentage of the scandium is 31%. In the magnesium-scandium composite film layer, when the content of the magnesium is too high and the content of the scandium is too low, hydrogen absorption and dehydrogenation time may be too long, with slow reaction, reduced conversion rate, and poor cyclic performance; and conversely, a dimming interval may be reduced accordingly.

Preferably, the magnesium-scandium composite film layer has a thickness of 10-80 nm. When the composite film layer is too thick, the hydrogen absorption and dehydrogenation time will be prolonged, reducing the cyclic performance. When the composite film layer is too thin, the transmittance of the film in a dehydrogenation state will be excessively high, shortening the dimming interval.

The palladium catalytic layer has a thickness of 3-7 nm. When the thickness of the palladium layer is too high, light is blocked, and the transmittance in a hydrogen absorption state is reduced. When the thickness of the palladium layer is too low, the film is likely to be destroyed due to a volume change caused by cyclic hydrogen absorption and dehydrogenation, and catalytic efficiency is reduced.

The fluorocarbon film layer has a thickness of 30-150 nm.

Preferably, the substrate includes any one of quartz glass, an optical fiber, conductive glass, polymethyl methacrylate, and flexible glass.

The present invention further provides a preparation method for the fluorocarbon/palladium/magnesium-scandium hydrogen-chromic film. The preparation method includes the steps of growing the magnesium-scandium composite film layer on the substrate by a magnetron co-sputtering method, then preparing the palladium catalytic layer on the magnesium-scandium composite film layer by a magnetron sputtering method, and finally preparing the fluorocarbon film on a surface of the palladium catalytic layer by a plasma vapor deposition method.

The method specifically includes the following steps:

S1, soaking the substrate in a cleaning solution, and then rinsing the substrate;

S2, placing the rinsed substrate in a magnetron sputtering reaction chamber, and turning on a vacuum system for vacuuming;

S3, heating the substrate, introducing a working gas A, maintaining a pressure, turning on power supplies of a palladium target, a magnesium target, and a scandium target after the pressure is stable, closing baffles in front of the targets, and performing pre-sputtering to clean the targets;

S4, after the pre-sputtering is completed, opening the baffles of the magnesium target and the scandium target, loading a co-sputtering process procedure, and depositing the magnesium-scandium composite film layer;

S5, after the depositing is completed in step S4, opening the baffle of the palladium target while maintaining a vacuum degree unchanged, loading a sputtering process procedure of the palladium catalytic layer, and depositing the palladium catalytic layer;

S6, after the depositing is completed in step S5, turning off the power supplies of all the targets, purging a sample with the working gas A continuously, then stopping introduction of the working gas A, and removing the sample; and S7, placing the removed sample in a reaction chamber of a reactive ion vapor deposition machine, introducing a working gas B, loading a plasma vapor deposition process procedure, and depositing the fluorocarbon film on the surface of the palladium catalytic layer; and after the depositing is completed, taking out the sample to obtain the fluorocarbon/palladium/magnesium-scandium hydrogen-chromic film.

Preferably, a preparation of the scandium target in the targets includes: preparing the scandium target from scandium with a purity (mass fraction) of 99.99%, and adding a copper backboard. By adding the copper backboard, electrical conductivity can be enhanced, even heat dissipation of the target is realized, and the target is protected.

Preferably, in step S1, the cleaning solution is a mixed solution of concentrated sulfuric acid and hydrogen peroxide at a volume ratio of 3:1. Impurities and pollutants on a surface of the substrate can be effectively removed without affecting composition of the substrate, and film forming quality of the substrate is improved.

Preferably, in step S3, the working gas A is argon, and argon ions generated after the gas is ionized can bombard the targets to excite target ions, do not react with the target ions, and have no effect on the composition of the film; the vacuuming is performed to a background vacuum degree of $8 \times 10^{-4}$-$9 \times 10^{-5}$ Pa;

in step S3, the substrate is heated to a temperature of 20-25° C., and the pressure is maintained at 0.4-0.6 Pa; and the pre-sputtering is performed for 5-20 min.

Preferably, in step S4, in the co-sputtering process procedure, sputtering powers used for the magnesium target and the scandium target are 20-100 W and 20-300 W, respectively, and a co-sputtering time is 30-100 s.

Preferably, in step S5, in the sputtering process procedure, a sputtering power used for the palladium target is 30-80 W, and a sputtering time is 10-60 s.

Preferably, in steps S4 and S5, the baffles in front of the targets are opened when the sputtering is performed, and the baffles are closed when the sputtering is not performed, which are controlled by the set sputtering process procedures.

Preferably, in step S7, the working gas B is a $C_4F_8$ gas; and a working pressure used in the plasma vapor deposition process procedure is 2-6 Pa, the gas B has a flow rate of 20-50 sccm and a gas excitation power of 400-800 W, and a deposition time is 10-100 s. The gas excitation power not only affects a combination method of fluorocarbon, but also affects the compactness of the film layer. When the power is too high, the film layer will be too compact, which may hinder passage of the gas and reduce hydrogen absorption and dehydrogenation efficiency. When the power is too low, the film layer will be too loose, which may weaken a hydrophobic effect, and reduce a protection effect on the inner film layer.

The opening and closing of the target baffles, the sputtering power, the sputtering time, and the deposition parameters of the fluorocarbon film can be precisely controlled by writing and importing the process procedures, resulting in a high degree of automation.

In the present invention, the magnesium-scandium composite film layer is grown on the substrate by the co-sputtering method first, then the palladium catalytic layer is grown on the film layer by the magnetron sputtering method, and finally the fluorocarbon protective layer is deposited on the periphery of the film layer by the plasma vapor deposition method. According to the present invention, the catalytic effect of the palladium film is utilized. In a hydrogen absorption stage, hydrogen is decomposed into hydrogen atoms for combining with a magnesium matrix to form a hydride, the scandium is added to accelerate diffusion of the hydrogen atoms in the magnesium matrix to promote the formation of the hydride, and the film is converted from a reflective state to a transparent state. In a dehydrogenation stage, the scandium can accelerate decomposition of the hydride, hydrogen atoms obtained from the process are diffused to the surface of the palladium film, and the film is returned to the reflective state. Meanwhile, the addition of the scandium can also effectively improve cyclic hydrogen absorption and desorption performance of the film, that is to say, a high reaction speed and a dimming interval can still be maintained after several hydrogen absorption and desorption reactions. The fluorocarbon film can be hydrophobic to a water product and effectively prevent corrosion of the inner film layer by an external environment. The entire reaction process is implemented without heating and pressurizing, and reversible conversion of the film between two states can be realized at room temperature. The dimming film has a rapid response, a short recovery time, a simple process, and an important application prospect in the field of hydrogen sensing.

Compared with the prior art, the present invention has the following beneficial effects.

1) A magnesium-scandium composite film is synthesized by a magnetron co-sputtering method, the entire process is controlled by a preset procedure and has simple operation and good stability, and the resulting film layer is uniform.

2) Due to the characteristic that scandium can improve hydrogen absorption and dehydrogenation kinetics of magnesium, scandium is compounded in a magnesium matrix, which can improve the microstructure and composition of a magnesium-based film, increase the diffusion rate of hydrogen atoms, improve the hydrogen absorption and dehydrogenation efficiency of the film, and improve cyclic performance of the film.

3) A palladium film has high oxidation resistance, palladium, undergoing an in-situ growth, protects a magnesium matrix layer more comprehensively, and can achieve reversible catalysis of hydrogen in a room temperature environment, posing low requirement for experimental conditions.

4) A fluorocarbon film has good permeability to gas molecules and strong hydrophobicity, which not only facilitates uniform distribution of the gas molecules on the surface of the film to accelerate a gasochomic reaction, but also can improve corrosion resistance of the film. A solid film can be produced at low temperature by a plasma vapor deposition method, and the film has a high binding force, and the reaction of producing the solid film is fast.

5) The film has a large dimming interval, a high optical conversion rate of hydrogen absorption and desorption, high cyclic hydrogen absorption and desorption durability, and an important application prospect.

BRIEF DESCRIPTION OF THE DRAWINGS

Other features, purposes, and advantages of the present invention will become more apparent by reading the detailed description of non-restrictive examples with reference to attached drawings below.

FIGS. 1A-1B show a structure of a film with the composition of CF/Pd/Mg-31% mol Sc prepared in Example 1 of the present invention and a transmittance curve obtained by testing in a hydrogen absorption process, in which FIG. 1A shows the structure of the film, and FIG. 1B shows the transmittance curve in the hydrogen absorption process;

DETAILED DESCRIPTION OF THE EMBODIMENTS

The present invention is described in detail in combination with specific examples below. The following examples will facilitate the present invention to be further understood by persons skilled in the art, and are not intended to limit the present invention in any manner. It is to be noted that for persons of ordinary skill in the art, various modifications and improvements can be made without departing from the concept of the present invention. All the modifications and improvements fall within the scope of protection of the present invention.

Example 1

Figure 1A:
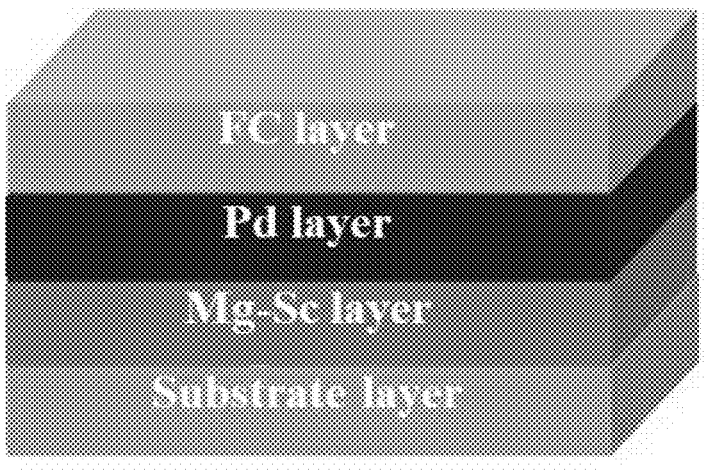
Figure 5:
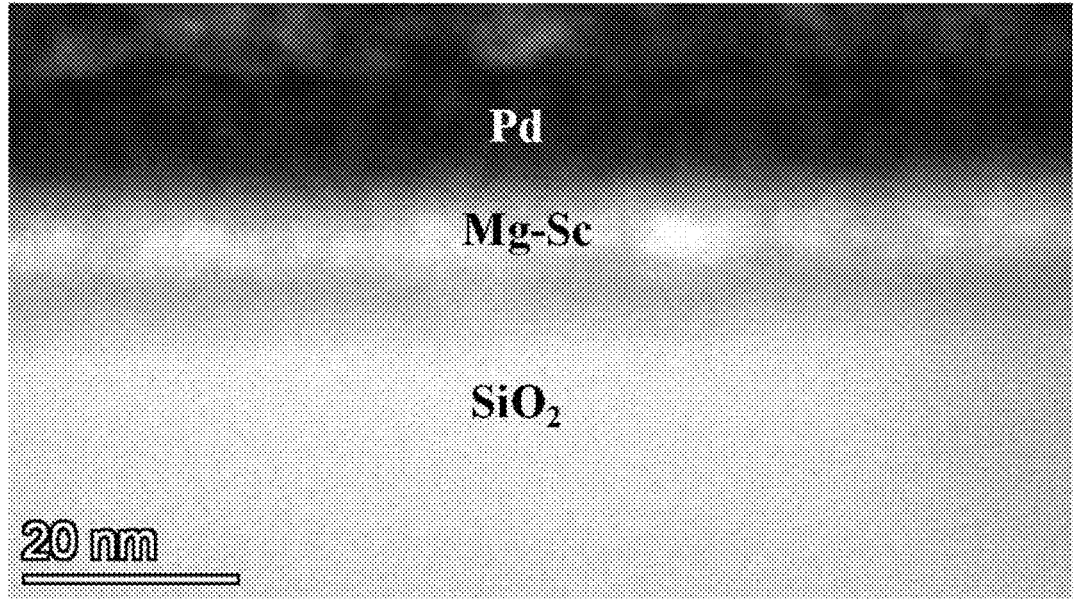
FIG. 5 shows a layered cross section of the CF/Pd/Mg-31% mol Sc film obtained by an analysis with a transmission electron microscope in Example 1 of the present invention.

This example provides a preparation method for a fluorocarbon/palladium/magnesium-scandium hydrogen-chromic film. The preparation method includes the following steps:

(1) preparing a scandium target from a scandium powder with a purity (mass fraction) of 99.99%, and adding a copper backboard, where the same scandium target is used in Examples 2-6 below;

(2) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $3 \times 10^{-4}$ Pa;

(3) heating the substrate to a temperature of 20-25° C., introducing a working gas A (argon), maintaining a pressure at 0.4-0.6 Pa, turning on power supplies of a palladium target, a magnesium target, and the scandium target after the pressure is stable, closing baffles in front of the targets, and performing pre-sputtering to clean the targets for 10 min; and then setting a co-sputtering process procedure, setting sputtering powers of the magnesium target and the scandium target at 40 W and 200 W, respectively, setting a co-sputtering time for 60 s, and depositing a magnesium-scandium film layer with a thickness of 50 nm;

(4) after the depositing is completed, loading a sputtering process procedure of a palladium catalytic layer while maintaining a vacuum degree at 0.5 Pa, adjusting a sputtering power of the palladium target to 80 W and a sputtering time to 14 s, and obtaining a film layer with a thickness of 5 nm; after growth of a palladium film is completed, turning off the power supplies of all the targets, purging a sample with the working gas A (argon) continuously for 1 min, and then taking out the sample to obtain a film with the composition of Pd/Mg-31% mol Sc, where a transmission electron microscope image of the obtained Pd/Mg-31% mol Sc film is as shown in FIG. 5;

(5) placing the Pd/Mg-31% mol Sc film in a reactive ion vapor deposition machine, and setting process parameters of a fluorocarbon film as follows: a working pressure is 4 Pa, a gas B flow rate is 40 sccm, a gas excitation power is 600 W, and a deposition time is 60 s; introducing a working gas B ($C_4F_8$), loading a process procedure, and depositing a fluorocarbon film layer with a thickness of 100 nm; and after the depositing is completed, taking out the sample to obtain a film with the composition of CF/Pd/Mg-31% mol Sc. The obtained film has a structure as shown in FIG. 1A, including a magnesium-scandium composite film layer (Mg—Sc layer), a palladium catalytic layer (Pd layer), and a fluorocarbon film layer (FC layer) that are sequentially arranged on the substrate.

Figure 1B:
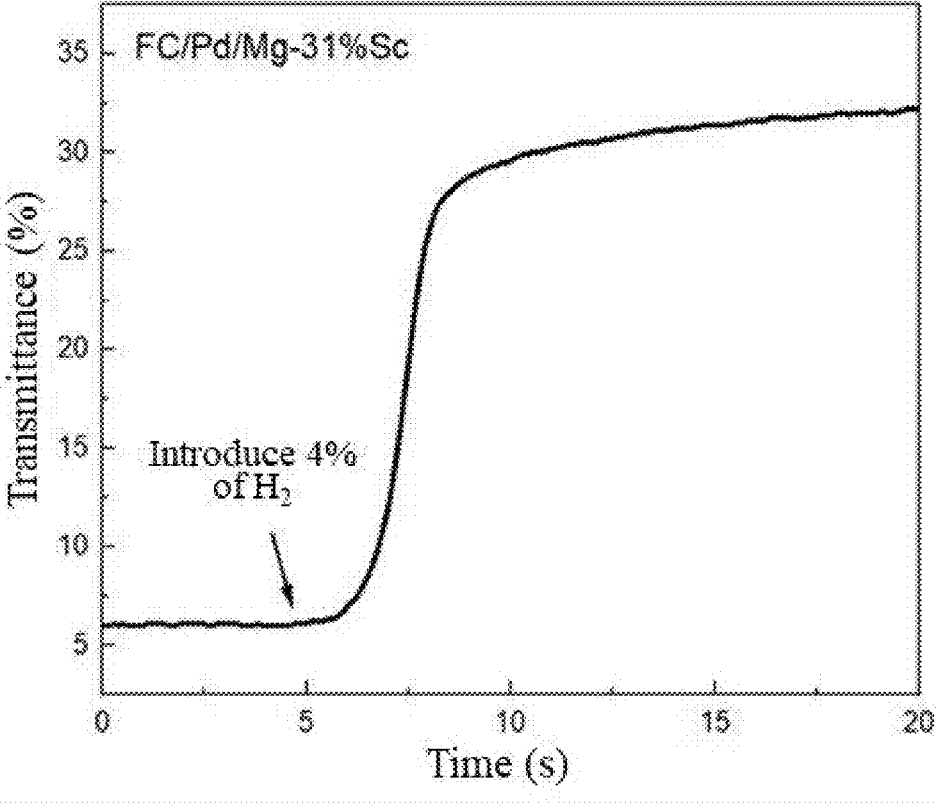

A schematic diagram of a transmittance curve of the CF/Pd/Mg-31% mol Sc film obtained by testing in a hydrogen absorption process is as shown in FIG. 1B. As can be seen from FIG. 1B, the CF/Pd/Mg-31% mol Sc film has a hydrogen absorption reaction time of about 5 s.

Figure 2:
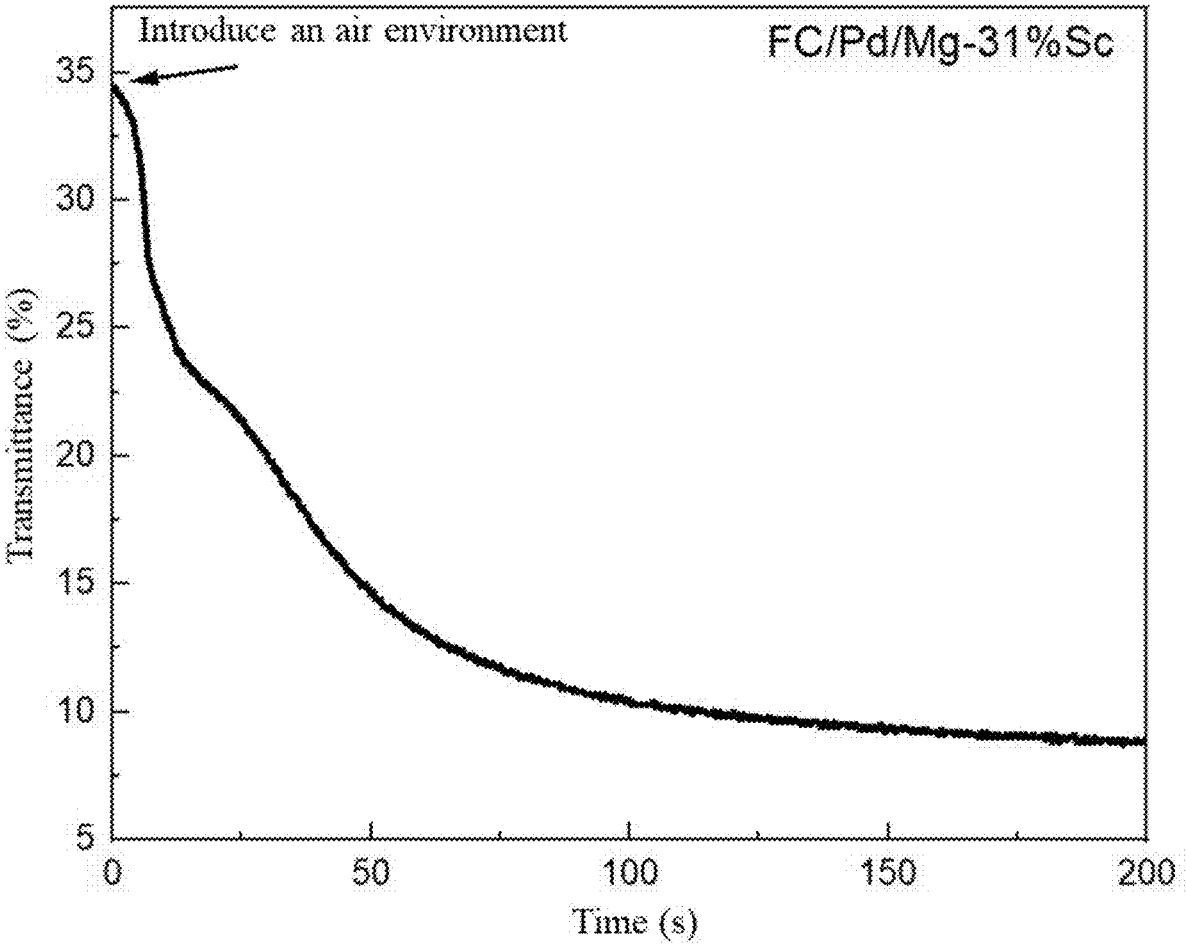
FIG. 2 shows a transmittance curve of the film with the composition of CF/Pd/Mg-31% mol Sc obtained by testing in a hydrogen desorption process in Example 1 of the present invention.

A schematic diagram of a transmittance curve of the CF/Pd/Mg-31% mol Sc film obtained by testing in a hydrogen desorption process is as shown in FIG. 2. As can be seen from FIG. 2, the CF/Pd/Mg-31% mol Sc film has a hydrogen desorption reaction time of about 70 s.

Figure 3:
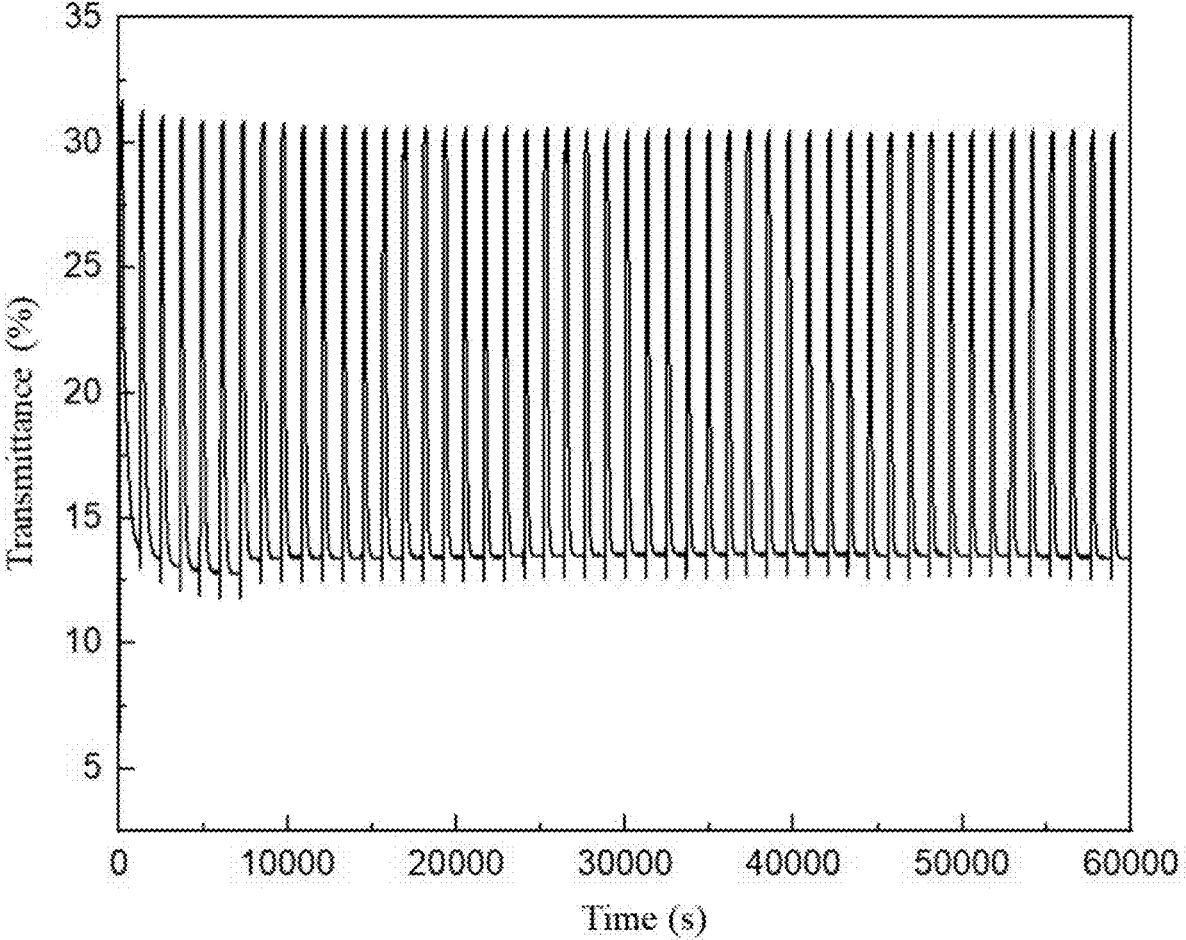
FIG. 3 shows a transmittance curve of the film with the composition of CF/Pd/Mg-31% mol Sc obtained by testing after 50 cycles of a hydrogen absorption and desorption reaction in Example 1 of the present invention.

A schematic diagram of a transmittance curve of the CF/Pd/Mg-31% mol Sc film obtained by testing after 50 cycles of a hydrogen desorption process is as shown in FIG. 3. As can be seen from FIG. 3, the CF/Pd/Mg-31% mol Sc film has good cyclic performance.

Example 2

This example provides a preparation method for a fluorocarbon/palladium/magnesium-scandium hydrogen-chromic film. The preparation method includes the following steps:

(1) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $3 \times 10^{-4}$ Pa;

(2) heating the substrate to a temperature of 20-25° C., introducing a working gas A (argon), maintaining a pressure at 0.4-0.6 Pa, turning on power supplies of a palladium target, a magnesium target, and a scandium target after the pressure is stable, closing baffles in front of the targets, and performing pre-sputtering to clean the targets for 10 min; and then setting a co-sputtering process procedure, setting sputtering powers of the magnesium target and the scandium target at 40 W and 40 W, respectively, setting a co-sputtering time for 60 s, and depositing a magnesium-scandium film layer with a thickness of 40 nm;

(3) after the depositing is completed, loading a sputtering process procedure of a palladium catalytic layer while maintaining a vacuum degree at 0.5 Pa, adjusting a sputtering power of the palladium target to 80 W and a sputtering time to 14 s, and obtaining a film layer with a thickness of 5 nm; after growth of a palladium film is completed, turning off the power supplies of all the targets, purging a sample with the working gas A continuously for 1 min, and then taking out the sample to obtain a film with the composition of Pd/Mg-9% mol Sc;

(4) placing the Pd/Mg-9% mol Sc film in a reactive ion vapor deposition machine, and setting process parameters of a fluorocarbon film as follows: a working pressure is 3 Pa, a gas B flow rate is 30 sccm, a gas excitation power is 400 W, and a deposition time is 30 s; introducing a working gas B ($C_4F_8$), loading a process procedure, and depositing a fluorocarbon film layer with a thickness of 20 nm; and after the depositing is completed, taking out the sample to obtain a film with the composition of CF/Pd/Mg-9% mol Sc.

Figure 4:
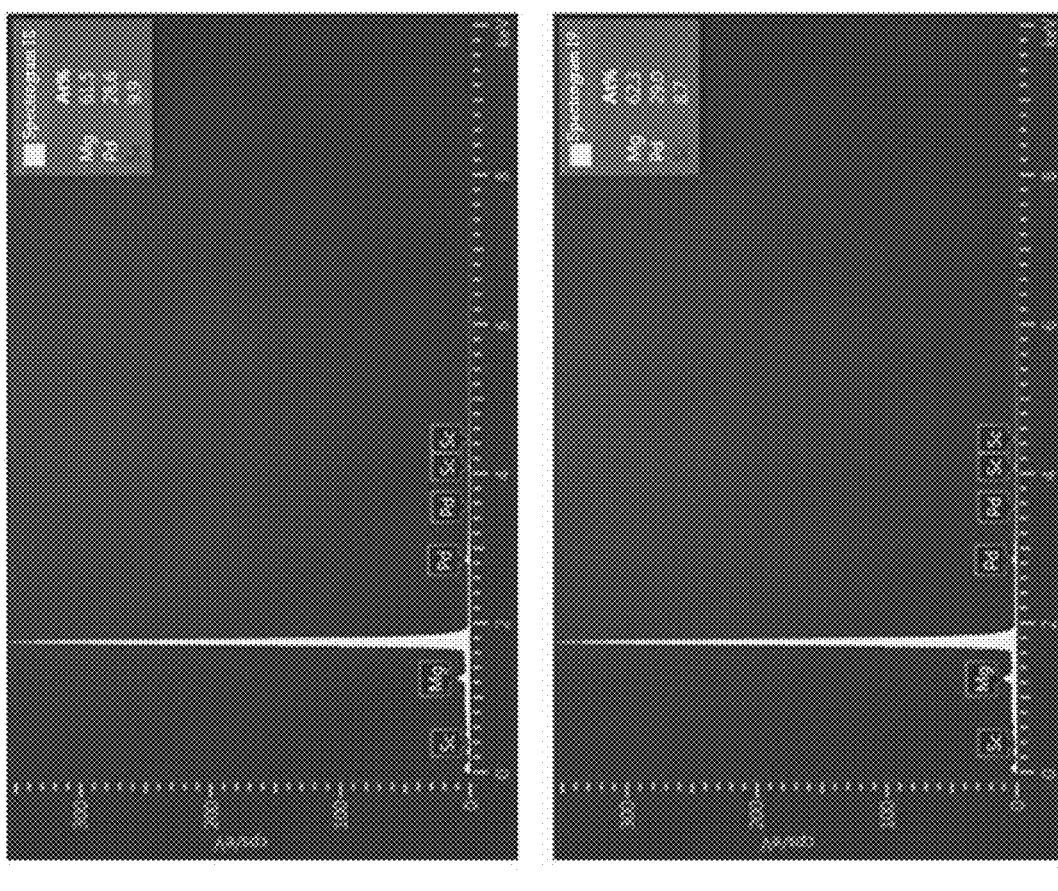
FIG. 4 shows energy dispersive spectroscopy (EDS) analysis results of a cross section of a film with the composition of CF/Pd/Mg-9% mol Sc obtained by testing in Example 2 of the present invention.
Figure 4:
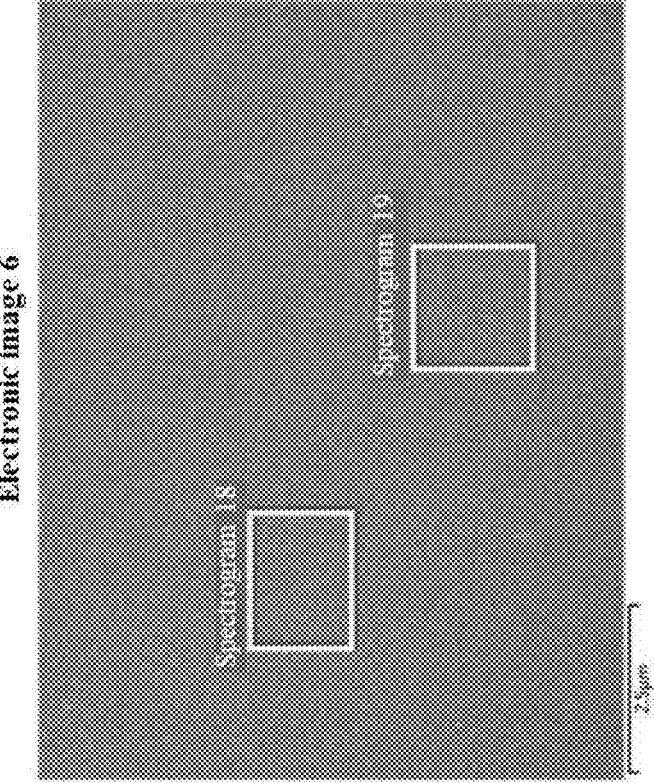

EDS analysis results of a cross section of the CF/Pd/Mg-9% mol Sc film are shown in FIG. 4. As can be confirmed from FIG. 4, the element Sc exists.

After testing, the obtained CF/Pd/Mg-9% mol Sc film has a hydrogen absorption reaction time of about 38 s and a hydrogen desorption reaction time of about 600 s.

Example 3

This example provides a preparation method for a fluorocarbon/palladium/magnesium-scandium hydrogen-chromic film. The preparation method includes the following steps:

(1) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $9 \times 10^{-5}$ Pa;

(2) heating the substrate to a temperature of 20-25° C., introducing a working gas A (argon), maintaining a pressure at 0.4-0.6 Pa, turning on power supplies of a palladium target, a magnesium target, and a scandium target after the pressure is stable, closing baffles in front of the targets, and performing pre-sputtering to clean the targets for 10 min; and then setting a co-sputtering process procedure, setting sputtering powers of the magnesium target and the scandium target at 40 W and 60 W, respectively, setting a co-sputtering time for 60 s, and depositing a magnesium-scandium film layer with a thickness of 25 nm;

(3) after the depositing is completed, loading a sputtering process procedure of a palladium catalytic layer while maintaining a vacuum degree at 0.5 Pa, adjusting a sputtering power of the palladium target to 60 W and a sputtering time to 20 s, and obtaining a film layer with a thickness of 4 nm; after growth of a palladium film is completed, turning off the power supplies of all the targets, purging a sample with the working gas A continuously for 1 min, and then taking out the sample to obtain a film with the composition of Pd/Mg-13% mol Sc;

(4) placing the Pd/Mg-13% mol Sc film in a reactive ion vapor deposition machine, and setting process parameters of a fluorocarbon film as follows: a working pressure is 3.5 Pa, a gas B flow rate is 35 sccm, a gas excitation power is 450 W, and a deposition time is 40 s; introducing a working gas B ($C_4F_8$), loading a process procedure, and depositing a fluorocarbon film layer with a thickness of 70 nm; and after the depositing is completed, taking out the sample to obtain a film with the composition of CF/Pd/Mg-13% mol Sc.

After testing, the obtained CF/Pd/Mg-13% mol Sc film has a hydrogen absorption reaction time of about 45 s and a hydrogen desorption reaction time of about 500 s.

Example 4

This example provides a preparation method for a fluorocarbon/palladium/magnesium-scandium hydrogen-chromic film. The preparation method includes the following steps:

(1) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $3 \times 10^{-4}$ Pa;

(2) heating the substrate to a temperature of 20-25° C., introducing a working gas A (argon), maintaining a pressure at 0.4-0.6 Pa, turning on power supplies of a palladium target, a magnesium target, and a scandium target after the pressure is stable, closing baffles in front of the targets, and performing pre-sputtering to clean the targets for 25 min; and then setting a co-sputtering process procedure, setting sputtering powers of the magnesium target and the scandium target at 20 W and 80 W, respectively, setting a co-sputtering time for 60 s, and depositing a magnesium-scandium film layer with a thickness of 30 nm;

(3) after the depositing is completed, loading a sputtering process procedure of a palladium catalytic layer while maintaining a vacuum degree at 0.5 Pa, adjusting a sputtering power of the palladium target to 80 W and a sputtering time to 25 s, and obtaining a film layer with a thickness of 7 nm; after growth of a palladium film is completed, turning off the power supplies of all the targets, purging a sample with the working gas A continuously for 1 min, and then taking out the sample to obtain a film with the composition of Pd/Mg-28% mol Sc;

(4) placing the Pd/Mg-28% mol Sc film in a reactive ion vapor deposition machine, and setting process parameters of a fluorocarbon film as follows: a working pressure is 5 Pa, a gas B flow rate is 40 sccm, a gas excitation power is 700 W, and a deposition time is 80 s; introducing a working gas B ($C_4F_8$), loading a process procedure, and depositing a fluorocarbon film layer with a thickness of 120 nm; and after the depositing is completed, taking out the sample to obtain a film with the composition of CF/Pd/Mg-28% mol Sc.

After testing, the obtained CF/Pd/Mg-28% mol Sc film has a hydrogen absorption reaction time of about 26 s and a hydrogen desorption reaction time of about 320 s.

Example 5

This example provides a preparation method for a fluorocarbon/palladium/magnesium-scandium hydrogen-chromic film. The preparation method includes the following steps:

(1) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $3 \times 10^{-4}$ Pa;

(2) heating the substrate to a temperature of 20-25° C., introducing a working gas A (argon), maintaining a pressure at 0.4-0.6 Pa, turning on power supplies of a palladium target, a magnesium target, and a scandium target after the pressure is stable, closing baffles in front of the targets, and performing pre-sputtering to clean the targets for 25 min; and then setting a co-sputtering process procedure, setting sputtering powers of the magnesium target and the scandium target at 40 W and 20 W, respectively, setting a co-sputtering time for 100 s, and depositing a magnesium-scandium film layer with a thickness of 40 nm;

(2) after the depositing is completed, loading a sputtering process procedure of a palladium catalytic layer while maintaining a vacuum degree at 0.5 Pa, adjusting a sputtering power of the palladium target to 80 W and a sputtering time to 25 s, and obtaining a film layer with a thickness of 7 nm; after growth of a palladium film is completed, turning off the power supplies of all the targets, purging a sample with the working gas A continuously for 1 min, and then taking out the sample to obtain a film with the composition of Pd/Mg-5% mol Sc;

(4) placing the Pd/Mg-5% mol Sc film in a reactive ion vapor deposition machine, and setting process parameters of a fluorocarbon film as follows: a working pressure is 5 Pa, a gas B flow rate is 40 sccm, a gas excitation power is 700 W, and a deposition time is 80 s; introducing a working gas B ($C_4F_8$), loading a process procedure, and depositing a fluorocarbon film layer with a thickness of 120 nm; and after the depositing is completed, taking out the sample to obtain a film with the composition of CF/Pd/Mg-5% mol Sc.

After testing, the obtained CF/Pd/Mg-5% mol Sc film has a hydrogen absorption reaction time of about 16 s and a hydrogen desorption reaction time of about 750 s.

Example 6

This example provides a preparation method for a fluorocarbon/palladium/magnesium-scandium hydrogen-chromic film. The preparation method includes the following steps:

(1) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $3 \times 10^{-4}$ Pa;

(2) heating the substrate to a temperature of 20-25° C., introducing a working gas A (argon), maintaining a pressure at 0.4-0.6 Pa, turning on power supplies of a palladium target, a magnesium target, and a scandium target after the pressure is stable, closing baffles in front of the targets, and performing pre-sputtering to clean the targets for 25 min; and then setting a co-sputtering process procedure, setting sputtering powers of the magnesium target and the scandium target at 40 W and 300 W, respectively, setting a co-sputtering time for 30 s, and depositing a magnesium-scandium film layer with a thickness of 40 nm;

(3) after the depositing is completed, loading a sputtering process procedure of a palladium catalytic layer while maintaining a vacuum degree at 0.5 Pa, adjusting a sputtering power of the palladium target to 80 W and a sputtering time to 25 s, and obtaining a film layer with a thickness of 7 nm; after growth of a palladium film is completed, turning off the power supplies of all the targets, purging a sample with the working gas A continuously for 1 min, and then taking out the sample to obtain a film with the composition of Pd/Mg-55% mol Sc;

(4) placing the Pd/Mg-55% mol Sc film in a reactive ion vapor deposition machine, and setting process parameters of a fluorocarbon film as follows: a working pressure is 5 Pa, a gas B flow rate is 40 sccm, a gas excitation power is 700 W, and a deposition time is 80 s; introducing a working gas B ($C_4F_8$), loading a process procedure, and depositing a fluorocarbon film layer with a thickness of 120 nm; and after the depositing is completed, taking out the sample to obtain a film with the composition of CF/Pd/Mg-55% mol Sc.

After testing, the obtained CF/Pd/Mg-55% mol Sc film has a hydrogen absorption reaction time of about 11 s and a hydrogen desorption reaction time of about 105 s.

Example 7

This example provides a preparation method for a fluorocarbon/palladium/magnesium-scandium hydrogen-chromic film. The preparation method includes the following steps:

(1) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $3\times10^{-4}$ Pa;

(2) heating the substrate to a temperature of 20-25° C., introducing a working gas A (argon), maintaining a pressure at 0.4-0.6 Pa, turning on power supplies of a palladium target, a magnesium target, and a scandium target after the pressure is stable, closing baffles in front of the targets, and performing pre-sputtering to clean the targets for 25 min; and then setting a co-sputtering process procedure, setting sputtering powers of the magnesium target and the scandium target at 20 W and 300 W, respectively, setting a co-sputtering time for 30 s, and depositing a magnesium-scandium film layer with a thickness of 40 nm;

(3) after the depositing is completed, loading a sputtering process procedure of a palladium catalytic layer while maintaining a vacuum degree at 0.5 Pa, adjusting a sputtering power of the palladium target to 80 W and a sputtering time to 25 s, and obtaining a film layer with a thickness of 7 nm; after growth of a palladium film is completed, turning off the power supplies of all the targets, purging a sample with the working gas A continuously for 1 min, and then taking out the sample to obtain a film with the composition of Pd/Mg-75% mol Sc;

(4) placing the Pd/Mg-75% mol Sc film in a reactive ion vapor deposition machine, and setting process parameters of a fluorocarbon film as follows: a working pressure is 5 Pa, a gas B flow rate is 40 sccm, a gas excitation power is 700 W, and a deposition time is 80 s; introducing a working gas B ($C_4F_8$), loading a process procedure, and depositing a fluorocarbon film layer with a thickness of 120 nm; and after the depositing is completed, taking out the sample to obtain a film with the composition of CF/Pd/Mg-75% mol Sc.

After testing, the obtained CF/Pd/Mg-75% mol Sc film has a hydrogen absorption reaction time of about 10 s and a hydrogen desorption reaction time of about 95 s.

Comparative Example

This comparative example provides a preparation method for a fluorocarbon/palladium/magnesium hydrogen-chromic film. The preparation method includes the following steps:

(1) sequentially soaking a quartz glass sheet in a prepared cleaning solution for 15 min and rinsing the quartz glass sheet with deionized water for 1 min, where the cleaning solution is a mixed solution of concentrated sulfuric acid and hydrogen peroxide at a ratio of 3:1; and placing the cleaned quartz glass substrate in a magnetron sputtering reaction chamber, and turning on a vacuum system for vacuuming to reach a background vacuum degree of $3\times10^{-4}$ Pa;

(2) heating the substrate to a temperature of 20-25° C., introducing a working gas A (argon), maintaining a pressure at 0.4-0.6 Pa, turning on power supplies of a palladium target and a magnesium target after the pressure is stable, closing baffles in front of the targets, and performing pre-sputtering to clean the targets for 25 min; and then setting a co-sputtering process procedure, setting a sputtering power of the magnesium target at 40 W, setting a sputtering time for 60 s, and depositing a magnesium film layer with a thickness of 25 nm;

(3) after the depositing is completed, loading a sputtering process procedure of a palladium catalytic layer while maintaining a vacuum degree at 0.5 Pa, adjusting a sputtering power of the palladium target to 80 W and a sputtering time to 25 s, and obtaining a film layer with a thickness of 7 nm; after growth of a palladium film is completed, turning off the power supplies of all the targets, purging a sample with the working gas A continuously for 1 min, and then taking out the sample to obtain a film with the composition of Pd/Mg;

(4) placing the Pd/Mg film in a reactive ion vapor deposition machine, and setting process parameters of a fluorocarbon film as follows: a working pressure is 5 Pa, a gas B flow rate is 40 sccm, a gas excitation power is 700 W, and a deposition time is 80 s; introducing a working gas B ($C_4F_8$), loading a process procedure, and depositing a fluorocarbon film layer with a thickness of 120 nm; and after the depositing is completed, taking out the sample to obtain a film with the composition of CF/Pd/Mg.

After testing, the obtained CF/Pd/Mg film has a hydrogen absorption reaction time of about 20 s and a hydrogen desorption reaction time of 900 s or above, and shows much lower cyclic performance than a fluorocarbon/palladium/magnesium-scandium system.

The present invention has many specific application ways, and the above description only shows preferred embodiments of the present invention. It should be noted that the above examples are merely used for illustrating the present invention and are not intended to limit the scope of protection of the present invention. For persons of ordinary skill in the art, various improvements can also be made without departing from the principle of the present invention, and the improvements should be regarded as falling within the scope of protection of the present invention.

What is claimed is:

1. A fluorocarbon/palladium/magnesium-scandium hydrogen-chromic film, consisting of
a magnesium-scandium composite film layer,
a palladium catalytic layer, and
a fluorocarbon film layer, wherein
the magnesium-scandium composite film layer, the palladium catalytic layer, and the fluorocarbon film layer are sequentially arranged on a substrate; and wherein a hydrogen absorption reaction time of the film is between 5 and 45 seconds, and a hydrogen desorption reaction time of the film is between 70 and 750 seconds.

2. The fluorocarbon/palladium/magnesium-scandium hydrogen-chromic film according to claim 1, wherein in the magnesium-scandium composite film layer, a molar percentage of scandium is 5-75%.

3. The fluorocarbon/palladium/magnesium-scandium hydrogen-chromic film according to claim 1, wherein the magnesium-scandium composite film layer has a thickness of 10-80 nm; the palladium catalytic layer has a thickness of 3-7 nm; and the fluorocarbon film layer has a thickness of 30-150 nm.

4. The fluorocarbon/palladium/magnesium-scandium hydrogen-chromic film according to claim 1, wherein the substrate comprises one of quartz glass, an optical fiber, conductive glass, polymethyl methacrylate, and flexible glass.

5. A preparation method for the fluorocarbon/palladium/magnesium-scandium hydrogen-chromic film according to claim 1, comprising steps of growing the magnesium-scandium composite film layer on the substrate by a magnetron co-sputtering method, then preparing the palladium catalytic layer on the magnesium-scandium composite film layer by a magnetron sputtering method, and finally preparing the fluorocarbon film layer on a surface of the palladium catalytic layer by a plasma vapor deposition method;
wherein the preparation method comprises the following steps:
S1, soaking the substrate in a cleaning solution, and then rinsing the substrate;
S2, placing a rinsed substrate in a magnetron sputtering reaction chamber, and turning on a vacuum system for vacuuming;
S3, heating the rinsed substrate, introducing a first working gas, maintaining a pressure, turning on power supplies of targets after the pressure is stable, closing baffles in front of the targets, and performing pre-sputtering to clean the targets, wherein the targets comprises a palladium target, a magnesium target, and a scandium target;
S4, after the pre-sputtering is completed, opening a baffle of the magnesium target and a baffle of the scandium target, loading a co-sputtering process procedure, and depositing the magnesium-scandium composite film layer;
S5, after the depositing is completed in the step S4, opening a baffle of the palladium target while maintaining a vacuum degree unchanged, loading a sputtering process procedure of the palladium catalytic layer, and depositing the palladium catalytic layer;
S6, after the depositing is completed in the step S5, turning off the power supplies of the targets, purging a sample with the first working gas continuously, then stopping an introduction of the first working gas, and removing a purged sample; and S7, placing the purged sample in a reaction chamber of a reactive ion vapor deposition machine, introducing a second working gas, loading a plasma vapor deposition process procedure, and depositing the fluorocarbon film layer on the surface of the palladium catalytic layer; and after a deposition of the fluorocarbon film layer is completed, taking out a resulting sample to obtain the fluorocarbon/palladium/magnesium-scandium hydrogen-chromic film.

6. The preparation method for the fluorocarbon/palladium/magnesium-scandium hydrogen-chromic film according to claim 5, wherein in the step S1, the cleaning solution is a mixed solution of concentrated sulfuric acid and hydrogen peroxide at a volume ratio of 3:1.

7. The preparation method for the fluorocarbon/palladium/magnesium-scandium hydrogen-chromic film according to claim 5, wherein in the step S3, the first working gas is argon; in the step S2, the vacuuming is performed to a background vacuum degree of $8\times10^{-4}$-$9\times10^{-5}$ Pa;
in the step S3, the rinsed substrate is heated to a temperature of 20-25° C., and the pressure is maintained at 0.4-0.6 Pa; and the pre-sputtering is performed for 5-20 min.

8. The preparation method for the fluorocarbon/palladium/magnesium-scandium hydrogen-chromic film according to claim 5, wherein in the step S4, in the co-sputtering process procedure, sputtering powers used for the magnesium target and the scandium target are 20-100 W and 20-300 W, respectively, and a co-sputtering time is 30-100 s.

9. The preparation method for the fluorocarbon/palladium/magnesium-scandium hydrogen-chromic film according to claim 5, wherein in the step S5, in the sputtering process procedure, a sputtering power used for the palladium target is 30-80 W, and a sputtering time is 10-60 s.

10. The preparation method for the fluorocarbon/palladium/magnesium-scandium hydrogen-chromic film according to claim 5, wherein in the step S7, the second working gas is a $C_4F_8$ gas; and a working pressure used in the plasma vapor deposition process procedure is 2-6 Pa, the second working gas has a flow rate of 20-50 sccm and a gas excitation power of 400-800 W, and a deposition time is 10-100 s.

11. The preparation method for the fluorocarbon/palladium/magnesium-scandium hydrogen-chromic film according to claim 5, wherein in the fluorocarbon/palladium/magnesium-scandium hydrogen-chromic film, a molar percentage of scandium in the magnesium-scandium composite film layer is 5-75%.

12. The preparation method for the fluorocarbon/palladium/magnesium-scandium hydrogen-chromic film according to claim 5, wherein in the fluorocarbon/palladium/magnesium-scandium hydrogen-chromic film, the magnesium-scandium composite film layer has a thickness of 10-80 nm; the palladium catalytic layer has a thickness of 3-7 nm; and the fluorocarbon film layer has a thickness of 30-150 nm.

13. The preparation method for the fluorocarbon/palladium/magnesium-scandium hydrogen-chromic film according to claim 5, wherein in the fluorocarbon/palladium/magnesium-scandium hydrogen-chromic film, the substrate comprises one of quartz glass, an optical fiber, conductive glass, polymethyl methacrylate, and flexible glass.

14. The preparation method for the fluorocarbon/palladium/magnesium-scandium hydrogen-chromic film according to claim 11, wherein in the step S1, the cleaning solution is a mixed solution of concentrated sulfuric acid and hydrogen peroxide at a volume ratio of 3:1.

15. The preparation method for the fluorocarbon/palladium/magnesium-scandium hydrogen-chromic film according to claim 12, wherein in the step S1, the cleaning solution is a mixed solution of concentrated sulfuric acid and hydrogen peroxide at a volume ratio of 3:1.

16. The preparation method for the fluorocarbon/palladium/magnesium-scandium hydrogen-chromic film according to claim 13, wherein in the step S1, the cleaning solution is a mixed solution of concentrated sulfuric acid and hydrogen peroxide at a volume ratio of 3:1.

17. The preparation method for the fluorocarbon/palladium/magnesium-scandium hydrogen-chromic film according to claim 11, wherein in the step S3, the first working gas is argon; in the step S2, the vacuuming is performed to a background vacuum degree of $8 \times 10^{-4}$-$9 \times 10^{-5}$ Pa;

in the step S3, the rinsed substrate is heated to a temperature of 20-25° C., and the pressure is maintained at 0.4-0.6 Pa; and the pre-sputtering is performed for 5-20 min.

18. The preparation method for the fluorocarbon/palladium/magnesium-scandium hydrogen-chromic film according to claim 12, wherein in the step S3, the first working gas is argon; in the step S2, the vacuuming is performed to a background vacuum degree of $8 \times 10^{-4}$-$9 \times 10^{-5}$ Pa;

in the step S3, the rinsed substrate is heated to a temperature of 20-25° C., and the pressure is maintained at 0.4-0.6 Pa; and the pre-sputtering is performed for 5-20 min.

19. The preparation method for the fluorocarbon/palladium/magnesium-scandium hydrogen-chromic film according to claim 13, wherein in the step S3, the first working gas is argon; in the step S2, the vacuuming is performed to a background vacuum degree of $8 \times 10^{-4}$-$9 \times 10^{-5}$ Pa;

in the step S3, the rinsed substrate is heated to a temperature of 20-25° C., and the pressure is maintained at 0.4-0.6 Pa; and the pre-sputtering is performed for 5-20 min.

20. The preparation method for the fluorocarbon/palladium/magnesium-scandium hydrogen-chromic film according to claim 11, wherein in the step S4, in the co-sputtering process procedure, sputtering powers used for the magnesium target and the scandium target are 20-100 W and 20-300 W, respectively, and a co-sputtering time is 30-100 s.

* * * * *